United States Patent
Yoo et al.

(10) Patent No.: US 10,744,684 B2
(45) Date of Patent: Aug. 18, 2020

(54) METHOD OF PREPARING PATTERNED CURED PRODUCT AND PATTERNED CURED PRODUCT OBTAINED USING THE METHOD

(71) Applicant: SAMSUNG DISPLAY CO., LTD., Yongin-si, Gyeonggi-do (KR)

(72) Inventors: Heemin Yoo, Yongin-si (KR); Yeonjoo Seo, Yongin-si (KR); Dahye Yoon, Yongin-si (KR); Hyunsup Yoon, Yongin-si (KR); Jungwoon Jung, Yongin-si (KR); Sungchan Jo, Yongin-si (KR); Kyunglae Rho, Yongin-si (KR); Sungwook Woo, Yongin-si (KR); Sooim Jeong, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 198 days.

(21) Appl. No.: 15/661,686

(22) Filed: Jul. 27, 2017

(65) Prior Publication Data
US 2018/0029255 A1 Feb. 1, 2018

(30) Foreign Application Priority Data
Jul. 28, 2016 (KR) .................. 10-2016-0096124

(51) Int. Cl.
*B29C 35/08* (2006.01)
*G03F 7/075* (2006.01)
(Continued)

(52) U.S. Cl.
CPC ............ *B29C 35/08* (2013.01); *G03F 7/0002* (2013.01); *G03F 7/0046* (2013.01); *G03F 7/027* (2013.01);
(Continued)

(58) Field of Classification Search
None
See application file for complete search history.

(56) References Cited

U.S. PATENT DOCUMENTS

| 2004/0137734 A1* | 7/2004 | Chou | ...................... B29C 33/60 |
| | | | 438/689 |
| 2010/0252188 A1* | 10/2010 | Inanami | .................. B32B 37/10 |
| | | | 156/280 |

(Continued)

FOREIGN PATENT DOCUMENTS

| KR | 1020110015304 A | 2/2011 |
| KR | 1020120039693 A | 4/2012 |

(Continued)

*Primary Examiner* — Satya B Sastri
(74) *Attorney, Agent, or Firm* — Cantor Colburn LLP

(57) ABSTRACT

A method of preparing a patterned cured product, the method including: providing a composition including a sol-gel reactive silicon-containing monomer, a polymerizable (meth)acryl monomer, a photoinitiator, and a fluorinating agent on a substrate to form a first layer on the substrate; contacting the first layer with a master mold to form a second layer including a pattern transferred by the master mold; and obtaining the patterned cured product from the second layer, wherein obtaining of the patterned cured product from the second layer includes a sol-gel reaction, a photocuring reaction, and a separating of the master mold.

20 Claims, 3 Drawing Sheets

(51) Int. Cl.
*G03F 7/027* (2006.01)
*G03F 7/029* (2006.01)
*G03F 7/00* (2006.01)
*G03F 7/004* (2006.01)
*G03F 7/031* (2006.01)
*B29L 31/00* (2006.01)

(52) U.S. Cl.
CPC .............. *G03F 7/029* (2013.01); *G03F 7/031* (2013.01); *G03F 7/0755* (2013.01); *B29C 2035/0827* (2013.01); *B29K 2995/007* (2013.01); *B29L 2031/7562* (2013.01)

(56) References Cited

U.S. PATENT DOCUMENTS

| | | |
|---|---|---|
| 2012/0128891 A1 | 5/2012 | Takei et al. |
| 2013/0136818 A1 | 5/2013 | Uehara et al. |
| 2013/0214453 A1 | 8/2013 | Umekawa et al. |
| 2014/0061970 A1 | 3/2014 | Sekine et al. |
| 2014/0349485 A1* | 11/2014 | Umekawa ......... H01L 31/02363 438/694 |
| 2015/0147533 A1 | 5/2015 | Yamada et al. |
| 2015/0240015 A1 | 8/2015 | Yamada et al. |

FOREIGN PATENT DOCUMENTS

| | | | |
|---|---|---|---|
| KR | 1020130096242 A | 8/2013 | |
| KR | 1020130115358 A | 10/2013 | |
| KR | 1020130140638 A | 12/2013 | |
| KR | 1020150013477 A | 2/2015 | |
| KR | 1020150073954 A | 7/2015 | |
| WO | WO-2015146709 A1 * | 10/2015 | ........... G03F 7/0046 |

* cited by examiner

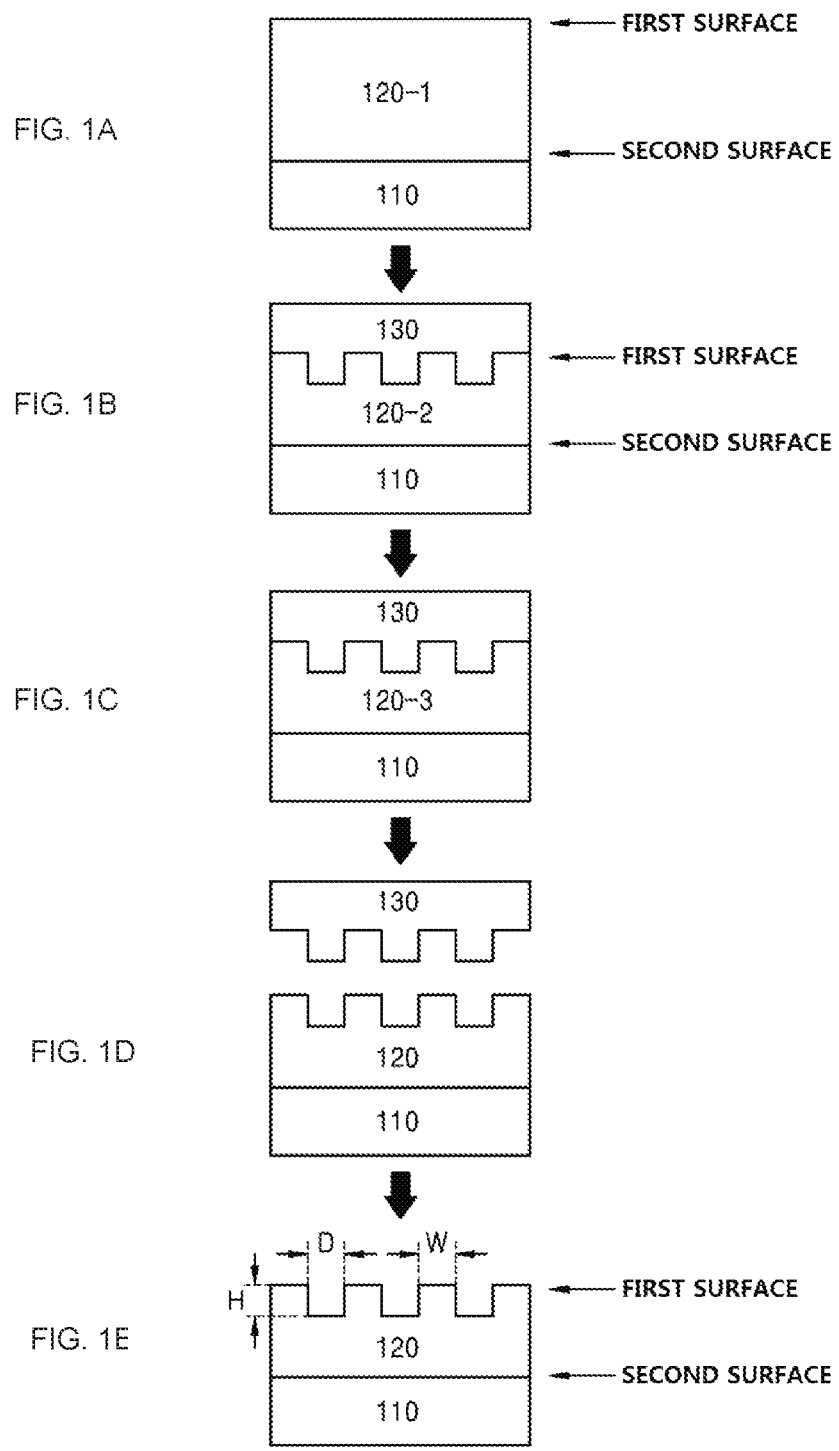

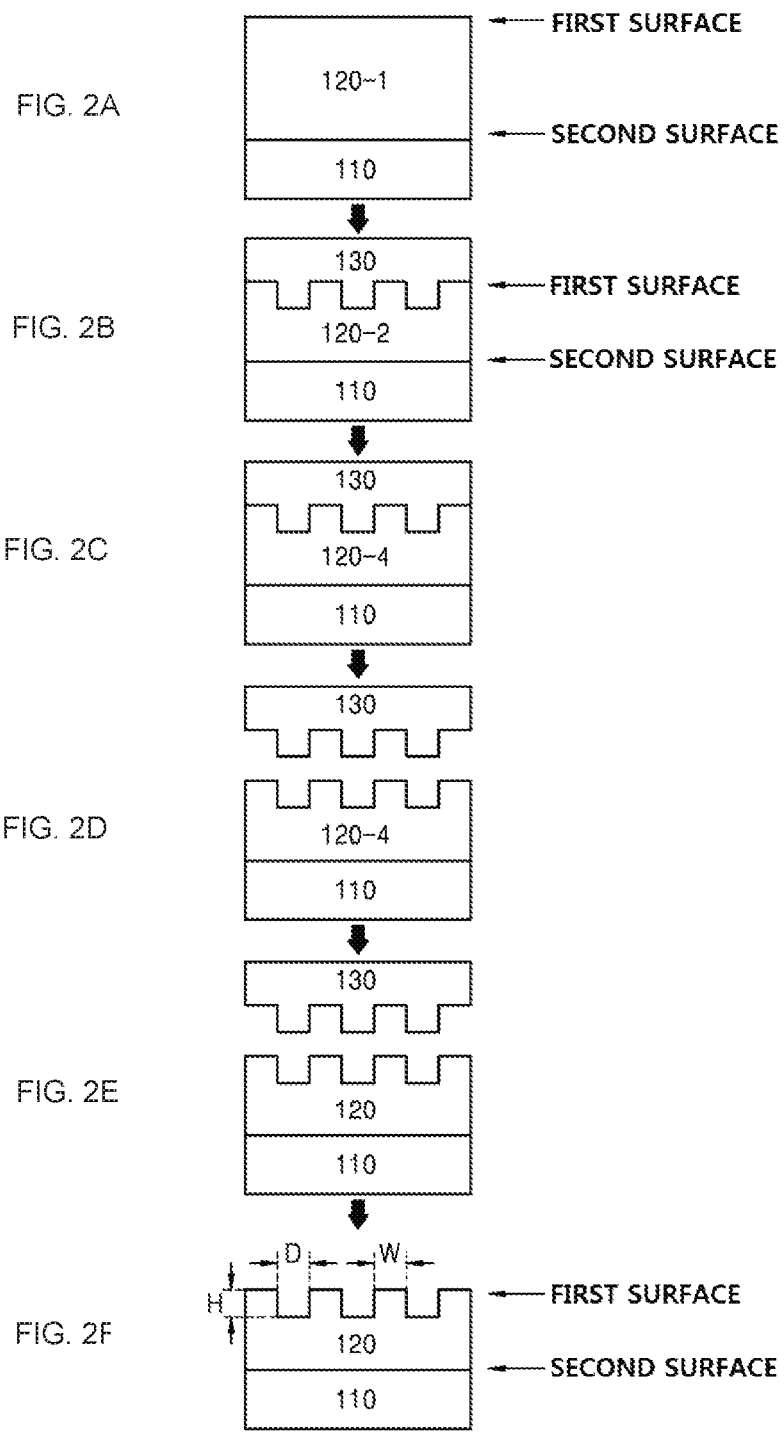

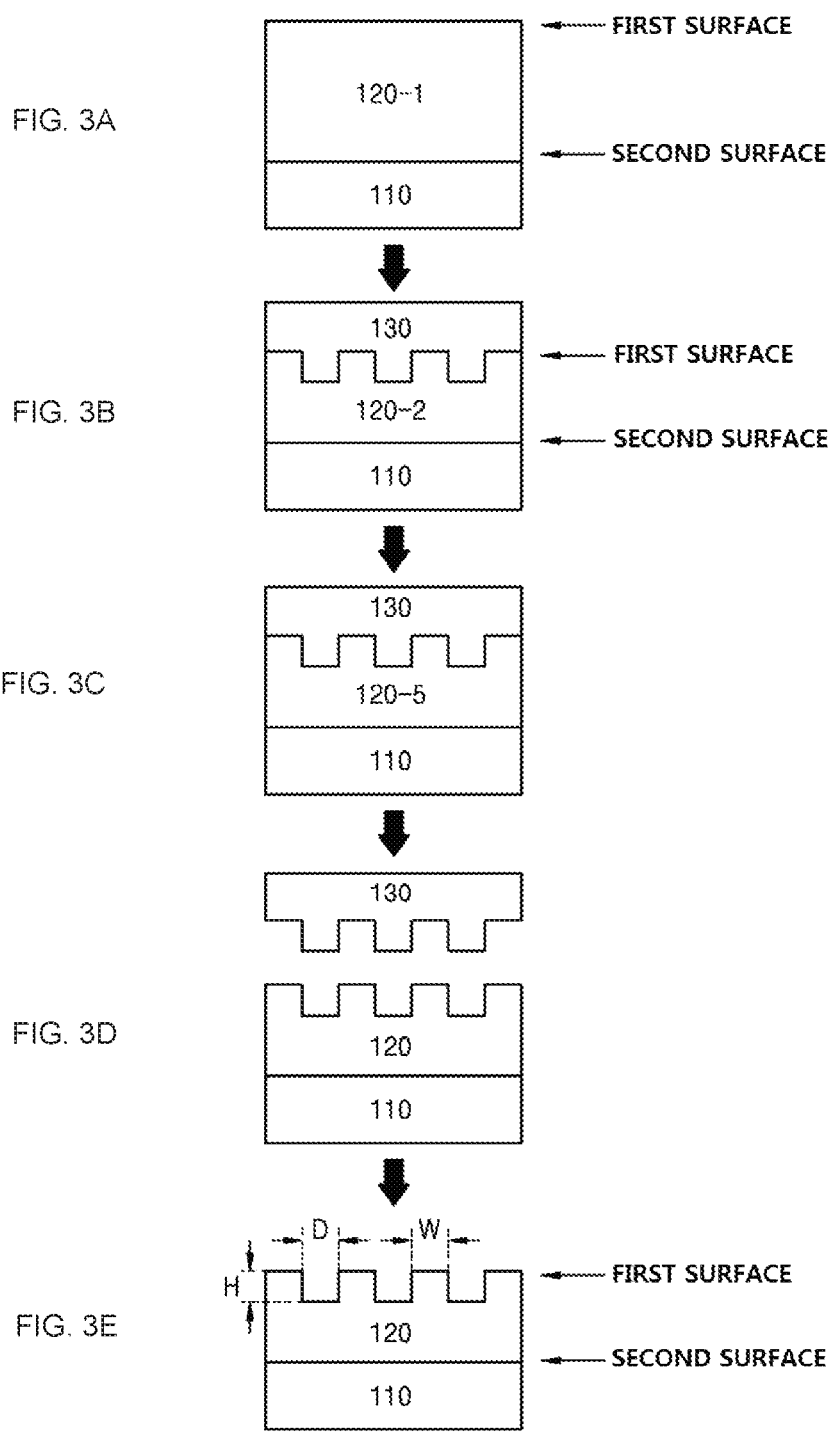

METHOD OF PREPARING PATTERNED CURED PRODUCT AND PATTERNED CURED PRODUCT OBTAINED USING THE METHOD

This application claims priority to and the benefit of Korean Patent Application No. 10-2016-0096124, filed on Jul. 28, 2016, the content of which is incorporated herein by reference in its entirety.

BACKGROUND

1. Field

One or more embodiments relate to a method of preparing a patterned cured product, and to a patterned cured product prepared using the method.

2. Description of the Related Art

With a recent increase in the desire for technology for effective formation of fine nano-patterns/nano-structures having various functionalities, research into nanoimprint lithography technology has increased. Nanoimprint lithography refers to the technology of imprinting a nanoscale pattern using a fine precision mold, as in stamping, which is relatively simple and costs less than conventional exposure processes. Such imprint lithography involves patterning a layer by applying an imprint resin onto the layer where a pattern is to be formed, pressing the pattern into the layer using a stamp having a desired pattern to imprint into the layer, and performing a dry or wet etching.

It is desirable that a cured product with a fine (e.g., nanoscale) pattern resulting from such a process has precise fine pattern formability, maintainability of pattern shape after curing, strong hardness and durability over repeated use, strong adhesion to a substrate, and relative ease of release from a mold.

SUMMARY

One or more embodiments include a method of preparing a patterned cured product suitable for fine (e.g. nanoscale) pattern formation and having strong hardness and durability over repeated use, and ease of release from a master mold. A patterned cured product prepared using the method is also disclosed.

According to one or more embodiments, a method of preparing a patterned cured product includes: providing a composition including a sol-gel reactive silicon-containing monomer, a polymerizable (meth)acryl monomer, a photoinitiator, and a fluorinating agent onto a substrate to form a first layer including the composition on the substrate; contacting the first layer with a master mold to form a second layer including a pattern transferred by the master mold; and obtaining the patterned cured product from the second layer, wherein the obtaining of the patterned cured product from the second layer includes a sol-gel reaction, a photocuring reaction, and a separating of the master mold.

According to one or more embodiments, a patterned cured product is prepared by the above-described method, wherein a concentration of the fluorinating agent in the patterned cured product is reduced in a direction from a first surface of the patterned cured product that does not contact the substrate toward a second surface of the patterned cured product that contacts the substrate, and the patterned cured products includes a polymer including at least one of a moiety represented by *—Si—O—Si—*' and a moiety represented by *—O—Si—O—*.

Additional aspects will be set forth in part in the description which follows and, in part, will be apparent from the description, or may be learned by practice of the presented embodiments.

BRIEF DESCRIPTION OF THE DRAWINGS

These and/or other aspects will become apparent and more readily appreciated from the following description of the embodiments, taken in conjunction with the accompanying drawings in which:

FIGS. 1A to 1E are schematic illustrations describing a method of preparing a patterned cured product, according to an embodiment;

FIGS. 2A to 2F are schematic illustrations describing a method of preparing a patterned cured product, according to another embodiment; and FIGS. 3A to 3E are schematic illustrations describing a method of preparing a patterned cured product, according to still another embodiment.

DETAILED DESCRIPTION

Reference will now be made in detail to embodiments of a method of preparing a patterned cured product, and a patterned cured product prepared by the method, examples of which are illustrated in the accompanying drawings, wherein like reference numerals refer to like elements throughout, and the sizes or thicknesses of elements are exaggerated for ease of description. In this regard, the present embodiments may have different forms and should not be construed as being limited to the descriptions set forth herein. Accordingly, the embodiments are merely described below, by referring to the figures, to explain aspects of the present description.

It will be understood that when an element such as a layer, a region or a component is referred to as being "on" another layer or element, it can be "directly on" the other layer or element, or intervening layers, regions, or components may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. Expressions such as "at least one of," when preceding a list of elements, modify the entire list of elements and do not modify the individual elements of the list. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, the term "(meth)acryl" includes any group containing the moiety $H_2C=CHRC(=O)—$ wherein R is hydrogen ("acryl" herein) or methyl ("methacryl" herein). "(Meth)acryl" includes the corresponding acids or salts thereof (referred to herein as "(meth)acrylic"), esters (referred to herein as "($C_1$-$C_{20}$ alkyl) (meth)acrylate"), and amides (referred to herein as "(meth)acrylamide").

A method of preparing a patterned cured product, according to an embodiment, will be described with reference to FIGS. 1A to 1E.

Referring to FIG. 1A, a composition including a sol-gel reactive silicon-containing monomer, a polymerizable (meth)acryl monomer, a photoinitiator, and a fluorinating agent may be provided on a substrate 110 to form a first layer 120-1 of the composition on the substrate 110.

By providing the composition as a mixture of a sol-gel reactive silicon-containing monomer, a polymerizable (meth)acryl monomer, a photoinitiator, and a fluorinating agent onto the substrate 110, the number of process steps may be reduced, and both strong hardness and improved ease of release which are important elements for the implementation of a fine pattern, may be satisfied at the same time.

The sol-gel reactive silicon-containing monomer of the composition may serve to increase the hardness of a patterned cured product 120 through a sol-gel reaction or a photocuring reaction.

For example, the sol-gel reactive silicon-containing monomer of the composition may be a monomer that 1) includes at least one silicon (Si) and at least one oxygen (O) and 2) serves as a starting material of a sol-gel reaction to form a material having a siloxane-based moiety such as *—Si—O—Si—*' and/or *—O—Si—O—*' as a reaction product of the sol-gel reaction.

As another example, the sol-gel reactive silicon-containing monomer may further include at least one polymerizable group such as a (meth)acryl group (e.g., a (meth)acrylic group, or a ($C_1$-$C_{20}$ alkyl) (meth)acrylate group), a vinyl group, or an allyl group, in addition to at least one Si and at least one O.

In some embodiments, the sol-gel reactive silicon-containing monomer may be a (meth)acryloxyalkylsilane. However, embodiments are not limited thereto.

For example, the sol-gel reactive silicon-containing monomer may include 2-methacryloxyethyl trimethoxysilane, 2-methacryloxyethyl triethoxysilane, 2-acryloxyethyltrimethoxysilane, 2-acryloxyethyltriethoxysilane, 3-methacryloxypropyltrimethoxysilane, 3-methacryloxypropyltriethoxysilane, 3-acryloxypropyltrimethoxysilane, 3-acryloxypropyltriethoxysilane, 4-methacryloxybutyltrimethoxysilane, 4-methacryloxybutyltriethoxysilane, 4-acryloxybutyltrimethoxysilane, 4-acryloxybutyltriethoxysilane, 5-methacryloxypentyltrimethoxysilane, 5-methacryloxypentyltriethoxysilane, 5-acryloxypentyltrimethoxysilane, 5-acryloxypentyltriethoxysilane, 6-methacryloxyhexyltrimethoxysilane, 6-methacryloxyhexyltriethoxysilane, 6-acryloxyhexyltrimethoxysilane, 6-acryloxyhexyltriethoxysilane, or any combination thereof. However, embodiments are not limited thereto.

The polymerizable (meth)acryl monomer of the composition may serve to increase the hardness of the patterned cured product 120 through a photocuring reaction.

For example, the polymerizable (meth)acryl monomer may be a monomer including at least one polymerizable group that may be polymerized by light irradiation (e.g. ultraviolet (UV) light irradiation), such as an acrylic group, a ($C_1$-$C_{20}$ alkyl) acrylate group, a vinyl group, or an allyl group.

In some embodiments, the polymerizable (meth)acryl monomer may be a multifunctional (meth)acrylate. However, embodiments are not limited thereto.

For example, the polymerizable acrylic monomer may include trimethylolpropane triacrylate, trimethylolpropane trimethacrylate, dipentaerythritol hexaacrylate, dipentaerythritol hexamethacrylate, ethylene glycol diacrylate, ethylene glycol dimethacrylate, diethylene glycol diacrylate, diethylene glycol dimethacrylate, triethylene glycol diacrylate, triethylene glycol dimethacrylate, tetraethylene glycol diacrylate, tetraethylene glycol dimethacrylate, pentaethylene glycol diacrylate, pentaethylene glycol dimethacrylate, hexaethylene glycol diacrylate, hexaethylene glycol dimethacrylate, or any combination thereof. However, embodiments are not limited thereto.

The photoinitiator of the composition may be selected from any materials that may initiate a photocuring reaction, which will be described later.

In some embodiments, the photoinitiator may include a phenone initiator such as an alkyl phenone photoinitiator, an acyl phosphine oxide photoinitiator, or a combination thereof. However, embodiments are not limited thereto.

For example, the photoinitiator may include bis(2,4,6-trimethylbenzoyl)-phenylphosphineoxide (e.g., IRGACURE® 819, available from Ciba Specialty Chemicals Corporation), 1-hydroxycyclohexyl phenyl ketone (e.g. IRGACURE® 184, available from Ciba Specialty Chemicals Corporation), diphenyl-(2,4,6-trimethylbenzoyl)phosphine oxide, or any combination thereof. However, embodiments are not limited thereto.

The fluorinating agent of the composition may impart improved ease of release to the patterned cured product 120 so that the patterned cured product 120 may be easily separated from a master mold 130, or from a base or a layer in which the pattern is formed.

The fluorinating agent may be an ether-based material including at least one fluorine.

In an embodiment, the fluorinating agent may be an ether-based material including carbon, fluorine, and oxygen.

As another embodiment, the fluorinating agent may be a perfluorinated ether-based material.

In some embodiments, the fluorinating agent may be a material represented by the following formula: F—(CF(CF$_3$)—CF$_2$—O)$_n$—CF$_2$CF$_3$ (wherein 3≤n≤5). However, embodiments are not limited thereto.

The fluorinating agent may not include a polymerizable group such as a vinyl group, or a sol-gel reactive group such as a combination of a silyl group and an alkoxy group, so that the fluorinating agent is not involved in a sol-gel reaction or a photocuring reaction used in forming the patterned cured product 120.

The fluorinating agent may have a hydrophobic property due to the presence of fluorine and may migrate toward a first surface of the first layer 120-1 and the second layer 120-2 that does not contact the substrate 110. Due to the migration of fluorinating agent, there is a relatively high concentration of fluorine at the first surface. As a result, the concentration of the fluorinating agent may be higher at the first surface as compared to the second surface of the patterned cured product 120.

In some other embodiments, the concentration of the fluorinating agent may decrease in a direction from the first surface of the first layer 120-1 and the second layer 120-2 that does not contact the substrate 110 toward a second surface of the first layer 120-1 and second layer 120-2 that contacts the substrate 110.

In some embodiments, the sol-gel reactive silicon-containing monomer may have a weight average molecular weight of about 234 grams per mole (g/mol) or greater to about 332 g/mol or less, or about 250 g/mol or greater to about 300 g/mol or less. The polymerizable (meth)acryl monomer may have a weight average molecular weight of about 170 g/mol or greater to about 647 g/mol or less, or about 200 g/mol or greater to about 550 g/mol or less. The fluorinating agent may have a weight average molecular weight of about 636 g/mol or greater to about 968 g/mol or less, or about 650 g/mol or greater to about 900 g/mol or less.

When the weight average molecular weights of the sol-gel reactive silicon-containing monomer, the polymerizable (meth)acryl monomer, and the fluorinating agent are within the above-mentioned ranges, the composition may have a relatively low viscosity.

For example, the composition including the sol-gel reactive silicon-containing monomer, a polymerizable (meth)acryl monomer, a photoinitiator, and the fluorinating agent may have a viscosity of about 2 centipoise (cP) or greater to about 40 cP or less or about 5 cP or greater to about 35 cP or less.

Due to the low viscosity characteristics, the composition may be uniformly applied on the substrate 110 to form the patterned cured product 120 having a precise nanoscale (e.g., fine) pattern.

When the fluorinating agent has a weight average molecular weight within the above range, the fluorinating agent layer may easily migrate toward the first surface of the first layer 120-1, and not be lost from the first layer 120-1 by, for example, evaporation.

In some embodiments, the weight ratio of the sol-gel reactive silicon-containing monomer to the polymerizable (meth)acryl monomer may be about 10:90 to about 70:30, or about 20:80 to about 60:40, or about 30:70. However, embodiments are not limited thereto.

In some other embodiments, the amount of the photoinitiator may be from about 1 part to about 6 parts by weight, or about 1 part by weight to about 5 parts by weight, and the amount of the fluorinating agent may be from about 1 part to about 5 parts by weight, or from about 1 part by weight to about 3 parts by weight, based on 100 parts by weight of a total weight of the sol-gel reactive silicon-containing monomer and the polymerizable (meth)acryl monomer. However, the embodiments are not limited thereto.

For example, a sum of the amounts of the photoinitiator and the fluorinating agent may be about 6 parts by weight or less based on 100 parts by weight of a total weight of the sol-gel reactive silicon-containing monomer and the polymerizable (meth)acryl monomer.

When the amounts of the components are within the above ranges, the patterned cured product 120 formed by the above-described method may have both improved hardness and storage stability.

Subsequently, the first layer 120-1 may be placed in contact with the master mold 130 to form a second layer 120-2 to which a pattern of the master mold 130 is transferred (see FIG. 1B).

In some embodiments, the master mold 130 may have a fine uneven pattern.

In some other embodiments, the master mold 130 may be a light-transmitting material, for example, quartz glass, ultraviolet (UV) light transmitting glass, sapphire, diamond, a silicon material such as polydimethyl siloxane, fluorine resin, or any combination thereof. When the substrate 110 is a light-transmitting material, the master mold 130 may be a non-light transmitting material, for example, metal, silicon, silicon carbide (SiC), mica, or any combination thereof.

In an embodiment, the contacting of the master mold 130 and the first layer 120-1 may be performed in a certain manner, for example, by moving a planar disc suitable for a roll process up and down, contacting a belt type disc, or roll transfer using a roll type disc or roll belt type disc.

As another example, the master mold 130 may have any shape, and for example, may be in the form of a plate, a belt, a roll, or a roll belt.

In some embodiments, since the composition including a sol-gel reactive silicon-containing monomer, a polymerizable (meth)acryl monomer, a photoinitiator, and a fluorinating agent has a low viscosity, the second layer 120-2 which includes a fine uneven pattern precisely transferred by the master mold 130, may be formed by pressing the master mold 130 against the first layer 120-1.

Next, the second layer 120-2 to which the pattern of the master mold 130 is transferred, may be subjected to a sol-gel reaction and then to a photocuring reaction, thus forming a third layer 120-3 including a polymer (see FIG. 1C). As used herein, the term "third layer" refers to a second layer to which the pattern of the master mold is transferred and which has been subjected to a sol-gel reaction and then a photocuring reaction. Then, the master mold 130 may be separated from the third layer 120-3 (see FIG. 1D), thus forming the patterned cured product 120.

In some embodiments, the sol-gel reaction may be performed by thermally treating the second layer 120-2 to which the pattern of the master mold 130 is transferred, at a temperature of about 70° C. to about 90° C., for about 1 hour to about 24 hours.

The sol-gel reaction may include a hydrolysis step, a water condensation step, an alcohol condensation step, or a combination thereof.

In an embodiment, the patterned cured product 120 including a polymer including at least one of a moiety represented by *—Si—O—Si—*' and a moiety represented by *—O—Si—O—*, may be obtained by the sol-gel reaction.

In some embodiments, to facilitate the sol-gel reaction, a sold-gel reaction catalyst may be provided to a surface of the first layer 120-1.

In an embodiment, the method of preparing the pattern cured product 120 may further include providing a sol-gel reaction catalyst to a surface of the first layer 120-1 after the formation of the first layer 120-1 and before the formation of the second layer 120-2. However, embodiments are not limited thereto.

As another embodiment, the sol-gel reaction catalyst may be a solution having a pH of about 1 to about 3. To prepare this acidic solution having a pH of about 1 to about 3, an inorganic acid, for example HCl, may be used.

In some embodiments, after the sol-gel reaction the photocuring reaction may be performed on the second layer 120-2 by UV irradiation at a dose of about 3 to 60 millijoules per square centimeter (mJ/cm$^2$) for about 1 second to about 30 minutes.

As a result, through the steps shown in FIGS. 1A through 1D, the patterned cured product 120 may be obtained (see FIG. 1E).

In some embodiments, the patterned cured product 120 prepared by using a method according to any of the above-described embodiments may include a fine pattern (e.g. a nanoscale pattern). Referring to FIGS. 1E, H, W, and D respectively denote a height, width, and distance in the fine pattern of the patterned cured product 120.

In an embodiment, the fine pattern of the patterned cured product 120 may have a pattern height (H) of about 50 nm to about 200 nm, a pattern width (W) of about 20 nm to about 200 nm, and a pattern distance (D) of about 20 nm to about 200 nm. However, embodiments are not limited thereto.

In some other embodiments, the patterned cured product 120 prepared by a method according to any of the above-described embodiments may have a strong surface hardness, and may stably maintain a pattern shape. When the patterned cured product 120 is used as a mold for nanoimprint lithography, a pattern shape of the mold may be precisely transferred.

For example, the patterned cured product 120 prepared by a method according to any of the above-described embodiments may have a surface hardness of about 100 megapascals (MPa) to about 600 MPa, as measured by an Ultra Nanoindentation Tester (UNHT) with a Berkovich indenter tip.

In some other embodiments, the patterned cured product 120 prepared by a method according to any of the above-described embodiments may have a small release force. Accordingly, when the master mold 130 or the patterned cured product 120 is used as a mold for nanoimprint lithography, the patterned cured product 120 may be easily released from a base or layer in which a target pattern is formed.

For example, the patterned cured product 120 prepared by a method according to any of the above-described embodiments, may have a release force of about 0.002 kilogram force (kgf) to about 0.150 kgf. However, embodiments are not limited thereto.

As used herein, the release force may be a minimum amount of force which is capable of releasing the pattern cured product 120 from the master mold 130. Alternatively, the release force may be a minimum force which is capable of releasing the pattern cured product 120 from a base or layer in which a target pattern is formed after pattern transfer by pressing the pattern cured product 120 against the base or layer in which a target pattern is to be formed. In some embodiments, the patterned cured product 120 prepared by a method according to any of the above-described embodiments may maintain a low release force, and thus may be used repeatedly as a mold.

For example, when the patterned cured product 120 is used as a mold for nanoimprint lithography, the release force may be measured using a Universal Testing Machine (UTM). For example, after pattern transfer to an imprint resin ink layer by pressing the patterned cured product 120 against the imprint resin ink layer and curing the resulting imprint resin layer, the release force may be measured as a minimum force capable of separating the patterned cured product 120 from the cured imprint resin layer.

In an embodiment, when the patterned cured product 120 is repeatedly used 20 times as a mold for nanoimprint lithography, the release force ($F_{d20}$) may be maintained at 0.100 kgf or less.

Use of a patterned cured product as a mold for nanoimprint lithography refers to pressing of the patterned cured product 120 against an imprint resin ink layer at a pressure of about 2 bar at a speed of about 5 millimeters per second (mm/sec) and then releasing the patterned cured product 120 with a force of 1 kgf.

In some embodiments, the patterned cured product 120 prepared by a method according to any of the above-described embodiments may be a mold or a resist layer for nanoimprint lithography. However, embodiments are not limited thereto.

For example, when the patterned cured product 120 is a mold for nanoimprint lithography, a nanostructure corresponding to a pattern of the mold may be prepared by using the mold for nanoimprint lithography.

When the patterned cured product 120 is a mold for nanoimprint lithography, the mold for nanoimprint lithography may have a pattern change ratio (ΔW) of about 0% to about 10%. The pattern change ratio is defined as follows by Equation 1.

$$\Delta W\ (\%) = ((W_0 - W_{20})/W_0) \times 100\% \qquad \text{Equation 1}$$

In Equation 1, $W_0$ is a pattern width of the patterned cured product 120 before the patterned cured product 120 is used as a mold for nanoimprint lithography, and $W_{20}$ is a pattern width of the patterned cured product 120 after the patterned cured product 120 has been used 20 times as a mold for nanoimprint lithography, wherein the use as a mold for nanoimprint lithography refers to pressing the patterned cured product against an imprint resin ink layer at a pressure of about 2 bar at a speed of about 5 mm/sec and then releasing the patterned cured product 120 with a force of 1 kgf.

In some embodiments, the patterned cured product 120 may be prepared by using a method according to any of the above-described embodiments.

The concentration of the fluorinating agent in the patterned cured product 120 may decrease in a direction from the first surface of the patterned cured product 120 that does not contact the substrate 110 toward the second surface thereof that contacts the substrate 110. The patterned cured product 120 may include a polymer including at least one of a moiety represented by *—Si—O—Si—*' and a moiety represented by *—O—Si—O—*.

When the concentration of the fluorinating agent at the first surface of the patterned cured product 120 is high, the patterned cured product 120 may be easily released from the master mold 130 or from a base or layer in which a target pattern is formed.

The moiety represented by *—Si—O—Si—*' and the moiety represented by *—O—Si—O—* may form a network structure, which may ensure improved hardness of the patterned cured product 120.

A method of preparing a patterned cured product, according to another embodiment, will be described with reference to FIGS. 2A through 2F.

Descriptions of FIGS. 2A and 2B correspond to those of (FIGS. 1A and 1B, respectively, and thus will be omitted.

Next, the second layer 120-2 to which the pattern of the master mold 130 is transferred may be subjected to photocuring reaction, thus to form a fourth layer 120-4 including a polymer (see FIG. 2C). Then, the master mold 130 may be separated from the fourth layer 120-4 (see FIG. 2D), and the layer 120-4 separated from the master mold 130 may be subjected to sol-gel reaction, thus to form a patterned cured product 120 (see FIG. 2E).

Descriptions of the photocuring reaction and the sol-gel reaction correspond to those described above with reference to FIG. 1C, and thus will be omitted.

In some embodiments, the sol-gel reaction may be performed by thermally treating the fourth layer 120-4 separated from the master mold 130, at a temperature of about 70° C. to about 90° C., for about 12 hours to about 24 hours.

As the thermal treatment time increases, the proportions of the moiety represented by *—Si—O—Si—*' and the moiety represented by *—O—Si—O—* may be increased, so that the pattern cured product 120 may have improved hardness.

In some embodiments, to facilitate the sol-gel reaction, a sol-gel reaction catalyst may be provided to a surface of the fourth layer 120-4 separated from the master mold 130.

In an embodiment, the method of preparing the pattern cured product 120 may further include providing a sol-gel reaction catalyst to a surface of the fourth layer 120-1 after the master mold 130 is separated from the fourth layer 120-4 and before the fourth layer 120-4 separated from the master mold 130 is subject to the sol-gel reaction. However, embodiments are not limited thereto.

For another example, the sol-gel reaction catalyst may be a solution having a pH of about 1 to about 3. To prepare this acidic solution having a pH of about 1 to about 3, an inorganic acid, for example, HCl may be used.

Through the steps shown in FIG. 2A to 2E, the patterned cured product 120 may be obtained (see (e) of FIG. 2).

A description of FIG. 2F corresponds to that of FIG. 1E, and thus will be omitted.

A method of preparing a patterned cured product, according to still another embodiment, will be described with reference to FIGS. 3A-3E.

Descriptions of FIGS. 3A and 3B correspond to those of FIGS. 1A and 1B, respectively, and thus will be omitted.

Next, the second layer 120-2 to which the pattern of the master mold 130 is transferred may be subjected to a photocuring reaction, thus to form a fifth layer 120-5 including a polymer (see FIG. 3C). Then, the fifth layer 120-5 may be subjected to a sol-gel reaction, and the master mold 130 may be separated from the fifth layer 120-5, thus to form a patterned cured product 120 (see FIG. 3D).

Descriptions of the photocuring reaction and the sol-gel reaction correspond to those described above with reference to FIG. 1C, and thus will be omitted.

Through the steps shown in FIGS. 3A to 3E, the patterned cured product 120 may be obtained (see FIG. 3E).

A description of FIG. 3E corresponds to that of FIG. 1E, and thus will be omitted.

One or more embodiments of the present disclosure will now be described in detail with reference to the following examples. However, these examples are only for illustrative purposes and are not intended to limit the scope of the one or more embodiments of the present disclosure.

Example 1

3-methacryloxypropyltrimethoxysilane (A), trimethylolpropane triacrylate (B), dipentaerythritol hexaacrylate (C), triethylene glycol diacrylate (D), Irgacure 819 (E), Irgacure 184 (F), and perfluoropolyether (G) were mixed to prepare a composition, as shown in Table 1 below, in which the amount of each material is percent (%) by weight. The composition was applied onto a polyethylene terephthalate (PET) substrate, having a size of 500 nm×500 nm×500 nm, to form a first layer having a thickness of about 1000 nm. The first layer was contacted with a master mold to form a second layer to which a pattern of the master mold was transferred. The second layer was subjected to a photocuring reaction by UV irradiation thus to form a fourth layer including a polymer. Subsequently, the fourth layer was separated from the master mold, and 0.1 molar (M) HCl in a 1:1 mixture of acetone to methanol was added to a surface of the fourth layer as a sol-gel reaction catalyst. The fourth layer was then thermally treated at about 80° C. for about 2 hours, thereby to prepare a patterned cured product. The patterned cured product had a fine pattern having a height (H) of about 100 nm, a width (W) of about 50 nm, and a distance (D) of about 30 nm. The structures of the above-described materials A through G are shown below.

A
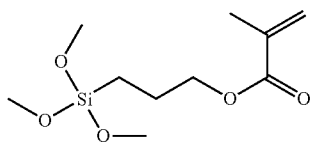

B
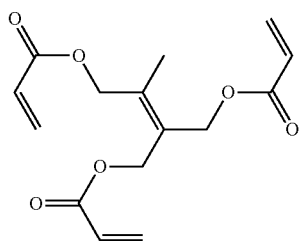

C
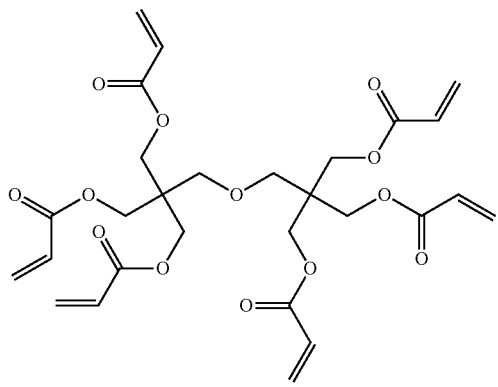

D
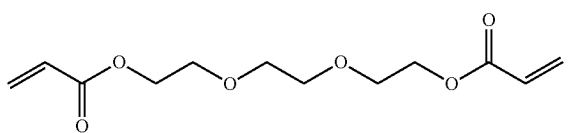

E
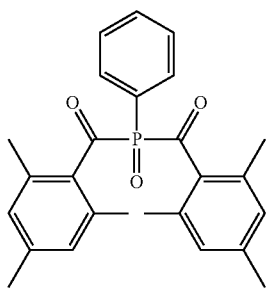

F
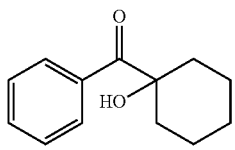

G
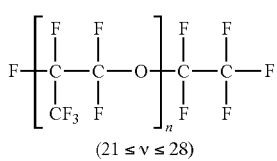

$(21 \leq v \leq 28)$

Example 2

A patterned cured product was prepared in the same manner as described in Example 1, except that the materials A to G were mixed to prepare a composition according to Table 1, wherein the amount of each material is % by weight.

Example 3

The materials A to G were mixed to prepare a composition according to Table 1, wherein the amount of each material is % by weight. The composition was applied onto a PET substrate to form a first layer including the composition. Then, 0.1 M HCl in a 1:1 mixture of acetone to methanol was added to the first layer as a sol-gel reaction catalyst. The first layer was contacted with a master mold to form a second layer to which a pattern of the master mold was transferred. The second layer was then thermally treated at about 80° C. for about 2 hours. The second layer after the sol-gel reaction was subjected to a photocuring reaction by applying UV irradiation thus to form a third layer including polymer. The third layer was separated from the master mold to thereby prepare a patterned cured product.

Example 4

A patterned cured product was prepared in the same manner as described in Example 1, except that the materials A to G were mixed to prepare a composition according to Table 1, wherein the amount of each material is % by weight.

Example 5

A patterned cured product was prepared in the same manner as described in Example 1, except that the materials A to G were mixed to prepare a composition according to Table 1, wherein the amount of each material is % by weight.

Example 6

A patterned cured product was prepared in the same manner as in Example 1, except that the materials A to G were mixed to prepare a composition according to Table 1, wherein the amount of each material is % by weight, and the fourth layer was thermally treated at about 80° C. for about 6 hours.

Example 7

A patterned cured product was prepared in the same manner as in Example 1, except that the materials A to G were mixed to prepare a composition according to Table 1, wherein the amount of each material is % by weight, and the fourth layer was thermally treated at about 80° C. for about 12 hours.

Example 8

A patterned cured product was prepared in the same manner as in Example 1, except that the materials A to G were mixed to prepare a composition according to Table 1, wherein the amount of each material is % by weight, and the fourth layer was thermally treated at about 80° C. for about 24 hours.

Comparative Example 1

A patterned cured product was prepared in the same manner as in Example 1, except that the materials A to G were mixed to prepare a composition according to Table 1, wherein the amount of each material is % by weight.

Comparative Example 2

The materials A to G were mixed to prepare a composition according to Table 1, wherein the amount of each material is % by weight. The composition was applied onto a PET substrate to form a first layer including the composition. The first layer was contacted with a master mold to form a second layer to which a pattern of the master mold was transferred. The second layer was subjected to a photocuring reaction by applying UV irradiation thus to form a sixth layer including a polymer. The sixth layer was separated from the master mold, thereby to obtain a patterned cured product.

Comparative Example 3

A patterned cured product was prepared in the same manner as in Comparative Example 2, except that the materials A to G were mixed to prepare a composition according to Table 1, wherein the amount of each material is % by weight.

cured product from the cured imprint resin layer was measured as an initial release force ($F_{d0}$). The results are shown in Table 2.

In Table 2, an initial release force less than 0.050 kgf is denoted by ⊚; an initial release force of from 0.050 kgf to 0.075 kgf is denoted by ○; an initial release force of from 0.075 kgf to 0.100 kgf is denoted by Δ; and an initial release force greater than 0.100 kgf is denoted by X.

Evaluation Example 3

A pattern change ratio of each of the pattern cured products was measured by measuring a pattern width ($W_0$) of each of the pattern cured products before use as a mold for nanoimprint lithography and comparing to a pattern width ($W_{20}$) of the patterned cured products after being used 20 times as a mold for nanoimprint lithography. A single use of a pattern cured product as a mold for nanoimprint lithography involved pressing the patterned cured product against an imprint resin ink layer at a pressure of about 2 bar at a speed of 5 mm/sec and releasing the patterned cured product therefrom with a force of about 1 kgf. The pattern change ratio ($\Delta W$) is defined by Equation 1.

$$\Delta W\ (\%) = ((W_0 - W_{20})/W_0) \times 100\% \qquad \text{Equation 1}$$

In Table 2, a pattern change ratio of less than 3% is denoted by ⊚; a pattern change ratio of from 3% to 6% is

TABLE 1

| | | Example 1 | Example 2 | Example 3 | Example 4 | Example 5 | Example 6 | Example 7 | Example 8 | Comparative Example 1 | Comparative Example 2 | Comparative Example 3 |
|---|---|---|---|---|---|---|---|---|---|---|---|---|
| Composition | A | 10 | 20 | 30 | 30 | 70 | 30 | 30 | 30 | 0 | 30 | 70 |
| | B | 30 | 27 | 23 | 23 | 10 | 23 | 23 | 23 | 33 | 23 | 10 |
| | C | 30 | 27 | 23 | 23 | 10 | 23 | 23 | 23 | 33 | 23 | 10 |
| | D | 30 | 27 | 23 | 23 | 10 | 23 | 23 | 23 | 33 | 23 | 10 |
| | E | 1 | 1 | 1 | 1 | 1 | 1 | 1 | 1 | 1 | 1 | 1 |
| | F | 5 | 5 | 5 | 5 | 5 | 5 | 5 | 5 | 5 | 5 | 5 |
| | G | 5 | 5 | 5 | 5 | 5 | 5 | 5 | 5 | 5 | 5 | 5 |
| Sol-gel reaction -> UV curing | | — | — | ○ | — | — | — | — | — | — | — | — |
| UV curing -> sol-gel reaction | | ○ | ○ | — | ○ | ○ | ○ | ○ | ○ | ○ | — | — |
| Sol-gel reaction time (hrs) | | 2 | 2 | 2 | 2 | 2 | 6 | 12 | 24 | 2 | — | — |
| Only UV curing reaction performed | | — | — | — | — | — | — | — | — | — | ○ | ○ |

Evaluation Example 1

The surface hardness of each of the prepared patterned cured products is measured using an Ultra Nanoindentation Tester (UNHT) with a Berkovich indenter tip. The results are shown in Table 2.

In Table 2, a surface hardness greater than 450 MPa is denoted by ⊚; a surface hardness of from 350 MPa to 450 MPa is denoted by ○; a surface hardness of from 250 MPa to 350 MPa is denoted by Δ; and a surface hardness less than 250 MPa is denoted by X.

Evaluation Example 2

Before using the patterned cured products as a mold for nanoimprint lithography by pressing the patterned cured product against an imprint resin layer and curing a resulting imprint resin layer, the force used to release the patterned denoted by ○; a pattern change ratio of about 6% to 9% is denoted by Δ; and a pattern change ratio greater than 9% is denoted by X.

Evaluation Example 4

After using a pattern of each of the patterned cured products 20 times as a mold for nanoimprint lithography by pressing the patterned cured product against an imprint resin layer and curing a resulting imprint resin layer, the force used to release the patterned cured product from the cured imprint resin layer was measured as a release force after 20 times of transfer ($F_{d20}$). The results are shown in Table 2. A single use of a pattern cured product as a mold for nanoimprint lithography involved pressing the patterned cured product against an imprint resin ink layer at a pressure of about 2 bar at a speed of 5 mm/sec and releasing the patterned cured product therefrom with a force of about 1 kgf.

In Table 2, a release force after 20 times of transfer of less than 0.050 kgf is denoted by ⊚; a release force after 20 times of transfer of 0.050 kgf to 0.075 kgf is denoted by ○; a release force after 20 times of transfer of 0.075 kgf to 0.100 kgf is denoted by Δ; and a release force after 20 times of transfer of greater than 0.100 kgf is denoted by X.

TABLE 2

| | Example 1 | Example 2 | Example 3 | Example 4 | Example 5 | Example 6 | Example 7 | Example 8 | Comparative Example 1 | Comparative Example 2 | Comparative Example 3 |
|---|---|---|---|---|---|---|---|---|---|---|---|
| Hardness | Δ | Δ | ○ | ○ | Δ | ○ | ⊚ | ⊚ | X | X | X |
| Initial release force($F_{d0}$) | Δ | Δ | ○ | ○ | Δ | ○ | ○ | ⊚ | X | ○ | ○ |
| Pattern change ratio | Δ | Δ | ○ | ○ | Δ | ○ | ⊚ | ⊚ | — | X | X |
| Release force after 20 times of transfer ($F_{d20}$) | Δ | Δ | ○ | ○ | Δ | ○ | ○ | ⊚ | — | X | X |

Referring to Table 2, the pattern cured products (Examples 2 to 8) prepared by methods according to the above-described embodiments were found to have higher hardness, a smaller initial release force, a smaller pattern change ratio, and a smaller release force after the repeated use as a mold for nanoimprint lithography, compared to those of the pattern cured products of Comparative Examples 1 to 3.

Among the pattern cured products of Example 4 and Examples 6 to 8, which are prepared in the same manner except that the thermal treatment time for the sol-gel reaction was 2 hours, 6 hours, 12 hours, and 24 hours, respectively, the patterned cured products of Examples 7 and 8 in which the thermal treatment time was 12 hours and 24 hours, respectively, have improved in hardness, initial release force, pattern change ratio, and release force consistency after repeated use, compared with the other pattern cured products.

In the pattern cured products of Example 1 to 5 in which the thermal treatment time was same, the pattern cured products of Examples 3 and 4 in which a weight ratio of the sol-gel reactive silicon-containing monomer to the polymerizable (meth)acryl monomer was 30:70 have improved results as compared with the other pattern cured products.

The pattern cured product of Comparative Example 1 not using a sol-gel reactive silicon-containing monomer was found to have a small hardness and a high initial release force. The pattern cured products of Comparative Examples 2 and 3, cured only by UV irradiation, have an improved small release force property, but is not enough to be improved in terms of hardness, pattern change ratio, and release force consistency after repeated use.

As described above, according to the one or more embodiments, a method of preparing a patterned cured product may use a composition including a sol-gel reactive silicon-containing monomer and a polymerizable (meth)acryl monomer, the composition having a relatively low viscosity and improved application characteristics, so that a patterned cured product having a precise fine pattern may be obtained by using the method.

According to the one or more embodiments, the method of preparing a patterned cured product may involve both a sol-gel reaction and a photocuring reaction, so that a patterned cured product having strong hardness, which may be repeatedly used for a long term as a mold, may be formed by the method.

According to the one or more embodiments, the method of preparing a patterned cured product may use a composition including a fluorinating agent, so that a patterned cured product having improved ease of release, which may be easily released from a master mold or from a base or layer in which a target pattern is formed, may be formed. Consequently, this may contribute to cost reduction and process simplification.

It should be understood that embodiments described herein should be considered in a descriptive sense only and not for purposes of limitation. Descriptions of features or aspects within each embodiment should be considered as available for other similar features or aspects in other embodiments.

While one or more embodiments have been described with reference to the figures, it will be understood by those of ordinary skill in the art that various changes in form and details may be made therein without departing from the spirit and scope of the inventive concept as defined by the following claims.

What is claimed is:

1. A method of preparing a patterned cured product, the method comprising:
   providing a composition comprising a sol-gel reactive silicon-containing monomer, a polymerizable (meth)acryl monomer, a photoinitiator, and a fluorinated agent onto a substrate to form a first layer comprising the composition on the substrate;
   contacting the first layer with a master mold to form a second layer comprising a pattern transferred by the master mold; and
   obtaining the patterned cured product from the second layer,
   wherein the obtaining of the patterned cured product from the second layer comprises performing a sol-gel reaction, a photocuring reaction, and a separating of the master mold,
   wherein the sol-gel reaction comprises thermal treatment at a temperature of about 70° C. to about 90° C. for about 1 hour to about 24 hours.

2. The method of claim 1, wherein the sol-gel reactive silicon-containing monomer comprises 2-methacryloxyethyl trimethoxysilane, 2-methacryloxyethyl triethoxysilane, 2-acryloxyethyltrimethoxysilane, 2-acryloxyethyltriethoxysilane, 3-methacryloxypropyltrimethoxy silane, 3-methacryloxypropyltriethoxysilane, 3-acryloxypropyltrimethoxysilane, 3-acryloxypropyltriethoxysilane, 4-methacryloxybutyltrimethoxysilane, 4-methacryloxybutyltriethoxysilane, 4-acryloxybutyltrimethoxysilane, 4-acryloxybutyltriethoxysilane, 5-methacryloxypentyltrimethoxysilane, 5-methacryloxypentyltriethoxysilane, 5-acryloxypentyltrimethoxysilane, 5-acryloxypentyltriethoxysilane, 6-methacryloxyhexyltrimethoxysilane, 6-methacryloxyhexyltriethoxysilane, 6-acryloxyhexyltrimethoxysilane, 6-acryloxyhexyltriethoxysilane, or a combination thereof.

3. The method of claim 1, wherein the polymerizable (meth)acryl monomer comprises trimethylolpropane triacrylate, trimethylolpropane trimethacrylate, dipentaerythritol hexaacrylate, dipentaerythritol hexamethacrylate, ethylene glycol diacrylate, ethylene glycol dimethacrylate, diethylene glycol diacrylate, diethylene glycol dimethacrylate, triethylene glycol diacrylate, triethylene glycol dimethacrylate, tetraethylene glycol diacrylate, tetraethylene glycol dimethacrylate, pentaethylene glycol diacrylate, pentaethylene glycol dimethacrylate, hexaethylene glycol diacrylate, hexaethylene glycol dimethacrylate, or a combination thereof.

4. The method of claim 1, wherein the photoinitiator comprises an alkyl phenone photoinitiator, an acyl phosphine oxide photoinitiator, or a combination thereof.

5. The method of claim 1, wherein the fluorinated agent comprises a polymer represented by the following formula:

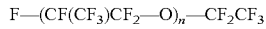

wherein 3≤n≤5.

6. The method of claim 1, wherein the sol-gel reactive silicon-containing monomer has a weight average molecular weight of about 234 grams per mole or greater to about 332 grams per mole or less,
the polymerizable (meth)acryl monomer has a weight average molecular weight of about 170 grams per mole or greater to about 647 grams per mole or less, and
the fluorinating agent has a weight average molecular weight of about 636 grams per mole or greater to about 968 grams per mole or less.

7. The method of claim 1, wherein a weight ratio of the sol-gel reactive silicon-containing monomer to the polymerizable (meth)acryl monomer is in a range of about 10:90 to about 70:30.

8. The method of claim 1, wherein an amount of the photoinitiator is from about 1 part to about 6 parts by weight, and an amount of the fluorinated agent is from about 1 part to about 5 parts by weight, each based on 100 parts by weight of a total weight of the sol-gel reactive silicon-containing monomer and the polymerizable (meth)acryl monomer.

9. The method of claim 1, wherein the obtaining of the patterned cured product from the second layer comprises:
performing the sol-gel reaction on the second layer;
performing the photocuring reaction on the second layer which underwent the sol-gel reaction to form a third layer comprising a polymer; and
separating the master mold from the third layer comprising the polymer.

10. The method of claim 9, wherein the sol-gel reaction is performed by thermally treating the second layer at a temperature of about 70° C. to about 90° C. for about 1 hour to about 24 hours, and
the photocuring reaction is performed by irradiating the second layer with ultraviolet light.

11. The method of claim 9, further comprising providing a sol-gel reaction catalyst to a surface of the first layer, after the first layer is formed and before the second layer comprising the pattern is formed.

12. The method of claim 1, wherein the obtaining of the patterned cured product from the second layer comprises:
performing the photocuring reaction on the second layer to form a fourth layer comprising a polymer;
separating the master mold from the fourth layer comprising the polymer; and
performing the sol-gel reaction on the fourth layer separated from the master mold.

13. The method of claim 12, wherein the photocuring reaction is performed by irradiating the second layer with ultraviolet light, and
the sol-gel reaction is performed by thermally treating the fourth layer separated from the master mold at a temperature of about 70° C. to about 90° C. for about 1 hour to about 24 hours.

14. The method of claim 12, further comprising providing a sol-gel reaction catalyst to a surface of the fourth layer separated from the master mold, after the separating of the master mold from the fourth layer and before the performing of the sol-gel reaction on the fourth layer separated from the master mold.

15. The method of claim 1, wherein the obtaining of the patterned cured product from the second layer comprises:
performing the photocuring reaction on the second layer;
performing the sol-gel reaction on the second layer which underwent the photocuring reaction, to form a fifth layer comprising a polymer; and
separating the master mold from the fifth layer.

16. The method of claim 1, wherein the patterned cured product comprises a nanoscale pattern, and
wherein the nanoscale pattern has a pattern height of from about 50 nanometers to about 200 nanometers, a pattern width of from about 20 nanometers to about 200 nanometers, and a pattern interval of from about 20 nanometers to about 200 nanometers.

17. The method of claim 1, wherein the patterned cured product has a surface hardness of about 100 megapascals to about 600 megapascals.

18. The method of claim 1, wherein the patterned cured product is a mold or a resist layer for nanoimprint lithography.

19. The method of claim 1, wherein the patterned cured product is a mold for nanoimprint lithography, and the mold for nanoimprint lithography has a pattern change ratio of about 0% to about 10%, wherein the pattern change ratio is defined by Equation 1:

$$\Delta W\ (\%) = ((W_0 - W_{20})/W_0) \times 100\ \text{percent} \qquad \text{Equation 1}$$

wherein, in Equation 1,
ΔW is the pattern change ratio,
$W_0$ is a pattern width of the patterned cured product before the patterned cured product is used as a mold for nanoimprint lithography, and
$W_{20}$ is a pattern width of the patterned cured product after the patterned cured product has been used 20 times as a mold for nanoimprint lithography,
wherein use as a mold for nanoimprint lithography is measured by pressing the patterned cured product against an imprint resin ink layer at a pressure of about 2 bar at a speed of about 5 millimeters per second and then releasing the patterned cured product with a force of 1 kilogram force.

20. A method of preparing a patterned cured product, the method comprising:
providing a composition comprising a sol-gel reactive silicon-containing monomer, a polymerizable (meth)acryl monomer, a photoinitiator, and a fluorinated agent onto a substrate to form a first layer comprising the composition on the substrate;

contacting the first layer with a master mold to form a second layer comprising a pattern transferred by the master mold; and obtaining the patterned cured product from the second layer, wherein the obtaining of the patterned cured product from the second layer comprises performing a sol-gel reaction, a photocuring reaction, and a separating of the master mold, and wherein the fluorinating agent comprises a polymer represented by the following formula:

$$F-(CF(CF_3)-CF_2-O)_n-CF_2CF_3$$

wherein $3 \leq n \leq 5$.

* * * * *